(12) United States Patent
Schauer

(10) Patent No.: US 7,063,301 B2
(45) Date of Patent: Jun. 20, 2006

(54) FACILITIES CONNECTION BUCKET FOR PRE-FACILITATION OF WAFER FABRICATION EQUIPMENT

(75) Inventor: Ronald Vern Schauer, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 510 days.

(21) Appl. No.: 09/906,395

(22) Filed: Jul. 15, 2001

(65) Prior Publication Data

US 2002/0084402 A1 Jul. 4, 2002

Related U.S. Application Data

(63) Continuation-in-part of application No. 09/706,435, filed on Nov. 3, 2000.

(51) Int. Cl.
*F16M 9/00* (2006.01)

(52) U.S. Cl. .................. 248/672; 248/678; 248/346.01; 220/571; 220/601; 220/630; 414/935

(58) Field of Classification Search ................ 248/672, 248/673, 677, 678, 679, 346.01, 346.05; 52/263; 414/935; 220/571, 572, 573, 601, 220/630
See application file for complete search history.

(56) References Cited

U.S. PATENT DOCUMENTS

| | | | |
|---|---|---|---|
| 444,533 A | | 1/1891 | Holden |
| 1,742,886 A | * | 1/1930 | Warman ............ 220/572 |
| 2,197,598 A | | 4/1940 | Way |
| 2,268,263 A | | 12/1941 | Newell et al. |
| 2,814,995 A | | 12/1957 | Sullivan, Jr. et al. |
| 2,867,301 A | * | 1/1959 | Benton ............ 52/263 |
| 3,036,375 A | | 5/1962 | Schlosser, Jr. et al. |
| 3,096,781 A | * | 7/1963 | Roidt ............ 137/314 |
| 3,676,568 A | | 7/1972 | Fork |
| 3,713,620 A | | 1/1973 | Tkach |
| 3,721,051 A | | 3/1973 | Fork |
| 3,843,281 A | | 10/1974 | Meylan et al. |
| 3,862,350 A | * | 1/1975 | Milosavich ............ 174/35 R |
| 3,902,615 A | * | 9/1975 | Levy et al. ............ 414/331.17 |
| 3,913,964 A | | 10/1975 | Lukeman |
| 3,932,696 A | | 1/1976 | Fork et al. |
| 4,012,873 A | | 3/1977 | Lindner |
| 4,178,469 A | | 12/1979 | Fork |
| 4,194,332 A | | 3/1980 | Fork |
| 4,209,660 A | * | 6/1980 | Flachbarth et al. ............ 174/48 |
| 4,243,197 A | | 1/1981 | Wright |

(Continued)

FOREIGN PATENT DOCUMENTS

| | | |
|---|---|---|
| EP | 0 094 780 A1 | 11/1983 |
| EP | 1 107 288 A2 | 6/2001 |
| WO | WO 99/03133 | 1/1999 |
| WO | WO 00/54930 | 9/2000 |

*Primary Examiner*—Ramon O. Ramirez
*Assistant Examiner*—Naschica S. Morrison
(74) *Attorney, Agent, or Firm*—Dugan & Dugan, PC

(57) ABSTRACT

A facilities connection locator is provided for use with a support apparatus for supporting manufacturing equipment. The facilities connection locator comprises a fluid tight bucket having a bottom surface, a plurality of side walls extending upwardly from the bottom surface, and a mounting mechanism adapted to mount the fluid tight bucket to the support apparatus so that the fluid tight bucket has a fixed position relative to the support apparatus in an x y and z axes. The facilities connection locator also comprises a fluid connection port, and may comprise a vacuum connection port surrounded by a fluid tight riser. A vacuum line connection may extend through the vacuum connection port and may have a locating flange located a predetermined distance from the connection's top surface, such that coupling the locating flange to the riser fixes the height of the vacuum line connection relative to the top of the riser.

16 Claims, 19 Drawing Sheets

U.S. PATENT DOCUMENTS

| | | |
|---|---|---|
| 4,289,921 A | 9/1981 | Gartner et al. |
| 4,323,723 A | 4/1982 | Fork et al. |
| 4,480,656 A | 11/1984 | Johnson |
| 4,505,449 A | 3/1985 | Turner et al. |
| 4,510,980 A | 4/1985 | Bartlett et al. |
| 4,523,416 A | 6/1985 | Payne et al. |
| 4,558,544 A | 12/1985 | Albrecht et al. |
| 4,572,474 A | 2/1986 | Derlich |
| 4,603,523 A | 8/1986 | Albrecht et al. |
| 4,685,585 A * | 8/1987 | Robbins .................. 220/256.1 |
| 4,696,496 A | 9/1987 | de Guelis et al. |
| 4,721,476 A | 1/1988 | Zeliff et al. |
| 4,722,298 A * | 2/1988 | Rubin et al. ................ 118/715 |
| 4,728,750 A | 3/1988 | Teslovich |
| 4,770,121 A * | 9/1988 | Ebata et al. ................ 118/686 |
| 4,835,924 A | 6/1989 | Blacklin et al. |
| 4,850,162 A | 7/1989 | Albrecht |
| 4,852,516 A | 8/1989 | Rubin et al. |
| RE33,220 E * | 5/1990 | Collier ........................ 52/263 |
| 5,083,364 A * | 1/1992 | Olbrich et al. ................ 29/564 |
| 5,098,221 A | 3/1992 | Osborne |
| 5,107,775 A | 4/1992 | Langlais et al. |
| 5,123,435 A | 6/1992 | Blacklin et al. |
| 5,152,635 A | 10/1992 | Ziu |
| 5,205,592 A | 4/1993 | Ziu |
| 5,246,044 A * | 9/1993 | Robertson et al. ............ 141/86 |
| 5,285,923 A * | 2/1994 | Brandon, Jr. ................ 220/601 |
| 5,297,896 A | 3/1994 | Webb |
| 5,323,903 A | 6/1994 | Bush et al. |
| 5,333,825 A | 8/1994 | Christensen |
| 5,398,620 A | 3/1995 | Rouch |
| 5,427,474 A | 6/1995 | Silvers |
| 5,437,303 A * | 8/1995 | Johnson ..................... 137/312 |
| 5,505,295 A * | 4/1996 | Whittington ................ 206/223 |
| 5,681,063 A | 10/1997 | Bressner |
| 5,713,550 A | 2/1998 | Schwarzli |
| 5,733,024 A | 3/1998 | Slocum et al. |
| 5,738,436 A | 4/1998 | Cummings et al. |
| 5,836,130 A * | 11/1998 | Unruh et al. ................. 52/698 |
| 5,881,760 A * | 3/1999 | Del Zotto .................... 137/264 |
| 6,061,983 A * | 5/2000 | McCleskey ................ 52/220.1 |
| 6,066,807 A | 5/2000 | Gudgeon |
| 6,133,981 A | 10/2000 | Semba |
| 6,173,856 B1 * | 1/2001 | Bierce et al. ............... 220/573 |
| 6,183,021 B1 | 2/2001 | Walsh et al. |
| 6,187,103 B1 * | 2/2001 | Huang et al. ............... 118/728 |
| 6,216,991 B1 * | 4/2001 | Okamoto ................. 248/188.1 |
| 6,230,735 B1 | 5/2001 | Bravo |
| 6,305,407 B1 | 10/2001 | Selby |
| 6,308,477 B1 * | 10/2001 | Santamaria ................ 52/220.1 |
| 6,312,525 B1 * | 11/2001 | Bright et al. ............... 118/719 |
| 6,324,800 B1 | 12/2001 | Valentz et al. |
| 6,328,345 B1 | 12/2001 | Moore et al. |
| 2002/0084402 A1 | 7/2002 | Schauer |
| 2002/0116882 A1 | 8/2002 | Reinke et al. |

\* cited by examiner

FACILITIES CONNECTION BUCKET FOR PRE-FACILITATION OF WAFER FABRICATION EQUIPMENT

This application is a continuation-in-part of U.S. patent application Ser. No. 09/706,435, filed Nov. 3, 2000, the entire disclosure of which is incorporated herein by this reference.

FIELD OF THE INVENTION

This invention relates generally to manufacturing equipment and more particularly to a method and apparatus for facilitating installation and use of wafer fabrication equipment in a manufacturing environment.

BACKGROUND OF THE INVENTION

For the installation of manufacturing equipment, and particularly when installing wafer fabrication equipment at a factory location, it becomes necessary to provide a separate structure to support the heavy tool and to transfer the weight thereof to the underlying floor (for example, a poured concrete waffle-grid floor). The equipment support structure is separate from the building support structure and typically comprises a plurality of fabricated support legs which each extend up from one of the solid sections of the underlying waffle-grid floor to engage a mounting foot on the underside of the equipment. The support legs, which may be steel jacks or poured concrete piers, are generally custom-fabricated for the installation, which necessarily requires additional time and expenditure. Crossbeam members attached to the support legs may also be required to support the weight of the equipment, particularly for irregularly-shaped systems for which a given mounting foot may not align to a solid section of the underlying flooring. In addition, if raised flooring is needed for access to the equipment, the prior art support method requires that yet another set of structural supports be installed to support the raised flooring.

The Semiconductor Equipment Manufacturing Institute (hereinafter "SEMI") has proposed a standard support structure to be used for all semiconductor factory locations. The proposed structure is a free-standing rectangular pedestal having a rectangular base with a plurality of legs positioned so as to evenly transmit the suspended weight of the equipment to the underlying floor structures. The legs of the SEMI pedestal extend up from the interstices of the waffle-grid floor at the basement or other facilities level beneath the manufacturing level flooring (or "raised flooring"), to support the rectangular base at the manufacturing level. The SEMI pedestal's rectangular base includes a plurality of connection points for bringing facilities (e.g., vacuum forelines, gas supply lines, electrical conduits, evacuation lines, etc.) from the lower facilities level up to the equipment level, and additionally includes floor support flanges attached at the periphery of the rectangular base to support raised flooring for operator access to the manufacturing equipment.

What has been proposed for installing manufacturing equipment in the SEMI pedestal is that, using a datum point which is outside of the rectangular base, the manufacturing equipment is aligned on the rectangular pedestal in such a way that an operator can access the machine from a position on the raised floor. The manufacturing equipment is then supported by crossbeams and cantilevers which attach to the rectangular base. As necessary, additional customized support legs may also be required when installing equipment on the SEMI pedestal. The advantages of using the SEMI pedestal include the fact that the pedestal may be of standard size, thereby providing a reference size for architects and construction personnel. In addition, with the standard pedestal having pre-established facilities connection locations, the manufacturing site can be pre-plumbed for provision of facilities such as vacuum lines, etc.

Drawbacks to the proposed SEMI pedestal include the customization necessary to ensure adequate support of irregularly-shaped equipment (i.e., neither rectangular nor to scale with the pedestal frame) and the retrofitting necessary to bring the facilities from the pre-plumbed locations on the rectangular base to the actual facilities connection points on the manufacturing equipment. Particularly when dealing with gas flow lines and evacuation lines, any additional line length and/or bends in the lines can have a major impact on the flow through the lines and consequently on the equipment and the processing conducted by the equipment.

Accordingly, an improved apparatus and method for providing pre-plumbing of facilities for manufacturing equipment installation is desired.

SUMMARY OF THE INVENTION

A facilities connection locator is provided for use with a support apparatus for supporting manufacturing equipment. The facilities connection locator comprises a fluid tight bucket having a bottom surface, a plurality of side walls extending upwardly from the bottom surface, and a mounting mechanism adapted to mount the fluid tight bucket to a support apparatus for supporting manufacturing equipment so that the fluid tight bucket has a fixed position relative to the support apparatus in an x-axis, a y-axis and a z-axis. The facilities connection locator also comprises at least one fluid connection port formed in the fluid tight bucket.

The facilities connection locator may also comprise a vacuum connection port and a fluid tight riser that surrounds the vacuum connection port. A vacuum line connection may extend through the vacuum connection port and may have a top surface and a locating flange located a predetermined distance from the top surface, such that coupling the locating flange to the fluid tight riser fixes the height of the vacuum line connection's top surface at a predetermined height relative to the top of the fluid tight riser.

Other features and advantages of the present invention will become more fully apparent from the following detailed description of the preferred embodiments, the appended claims and the accompanying drawings.

DESCRIPTION OF THE PREFERRED EMBODIMENT

The present invention improves upon the facilities connection locator (referenced by numeral 150 in FIG. 4, and described with reference thereto). The improved facilities connection, like the facilities connection of the parent application, is for use adjacent the facilities connection of a piece of equipment. The improved facilities connection may additionally function as a drip pan for catching fluid that may leak from a liquid facilities line, and/or may include features that aid in precise location of equipment facilities connections relative to an equipment support pedestal to which the improved facilities connection is coupled. The improved facilities connection is described in detail with reference to FIGS. 11–18, and may be used with any pedestal or method that enables equipment facilities to be located prior to equipment installation; the specific pedestals described with reference to FIGS. 1–10 are one such apparatus and method for locating equipment facilities.

Figure 1:
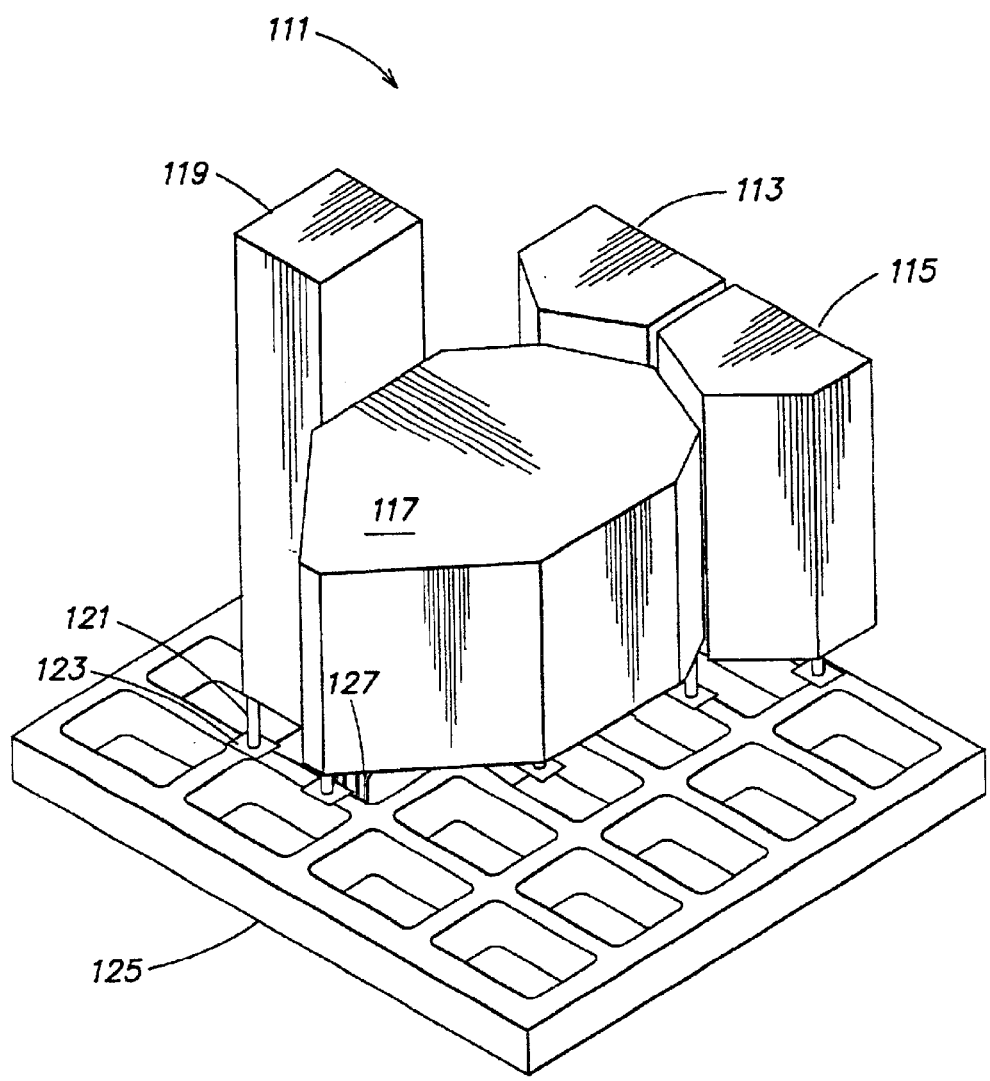
FIG. 1 is a schematic top perspective view of manufacturing equipment installed at a manufacturing location in accordance with the prior art.

FIG. 1 is a schematic top perspective view of manufacturing equipment installed at a manufacturing location in accordance with the prior art. As depicted therein, manufacturing equipment 111, shown as semiconductor processing equipment including two loadlock chambers 113 and 115, a mainframe 117 and one or more processing chambers 119 (only one shown), is supported by a plurality of support legs 121 which extend from mounting feet (not shown) on the bottom of the manufacturing equipment 111 down to base mount location pads 123 disposed on an underlying waffle-grid floor 125. Typically each of the support legs 121 is custom fabricated for the installation, in order to assure that the manufacturing equipment 111 is level, and also so as to connect the support legs to the interstices of the waffle sub-floor. Generally, the suppliers of the manufacturing equipment 111 will provide mounting feet (not shown) which are of adjustable height. In that way upon final installation of the manufacturing equipment 111, when each of the mounting feet is attached to a support leg 121, final leveling of the manufacturing equipment 111 can be conducted by adjusting the height of each of the mounting feet. While a manufacturing location will have facilities lines 127 brought to the manufacturing level, further plumbing is required for connection of the facilities lines 127 to the manufacturing equipment 111 after the physical installation (i.e., anchoring of the manufacturing equipment 111 on support legs 121 and leveling thereof) is completed. As noted above, disadvantages of the FIG. 1 prior art installation include the additional time and cost for providing customized support legs 121 and the difficulty in pre-planning or pre-facilitating the manufacturing location due to the fact that the locations of the support legs 121 may interfere with pre-plumbed facilities lines 127.

Figure 2:
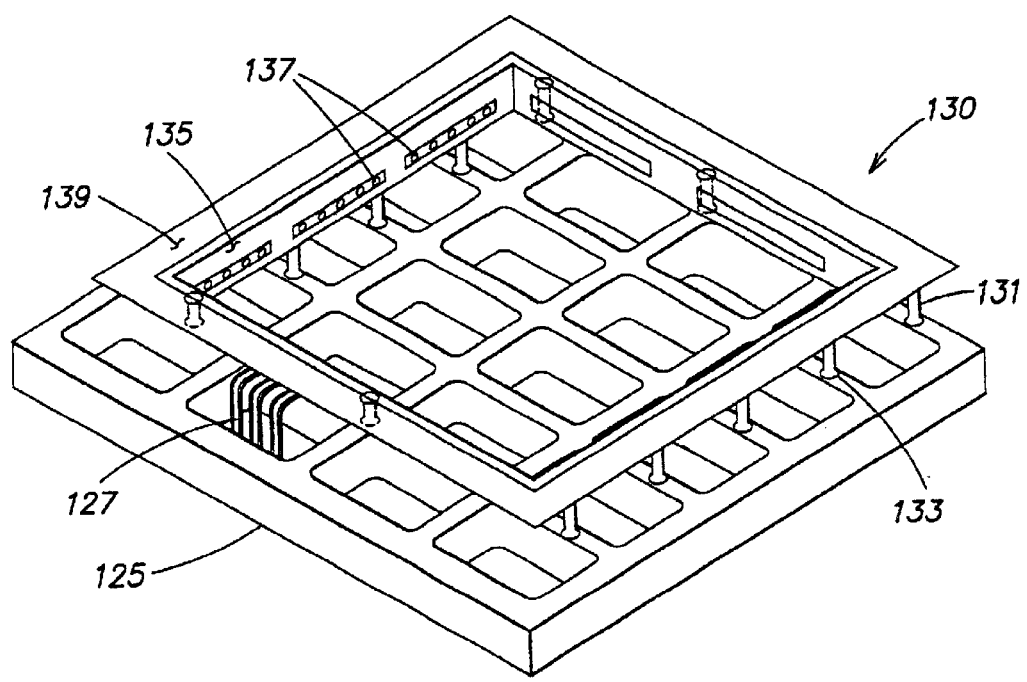
FIG. 2 is a schematic top perspective view of the proposed SEMI rectangular support pedestal installed at a manufacturing location.

FIG. 2 is a schematic top perspective view of the proposed rectangular SEMI support pedestal 130 installed at a manufacturing location. The SEMI support pedestal 130 provides an alternative to the customized support legs 121 of FIG. 1. The SEMI support pedestal 130 comprises a rectangular pedestal frame 135 supported on a plurality of SEMI support pedestal legs 131, each of which is aligned to or near one of the interstices of the waffle-grid floor 125. The SEMI pedestal frame 135 includes a plurality of SEMI facilities connection locations 137 for establishing pre-facilitation locations to which facilities lines 127 can be pre-plumbed prior to the installation of the manufacturing equipment 111 of FIG. 3. The SEMI pedestal frame 135 additionally may be adapted to support raised flooring 139.

Figure 3:
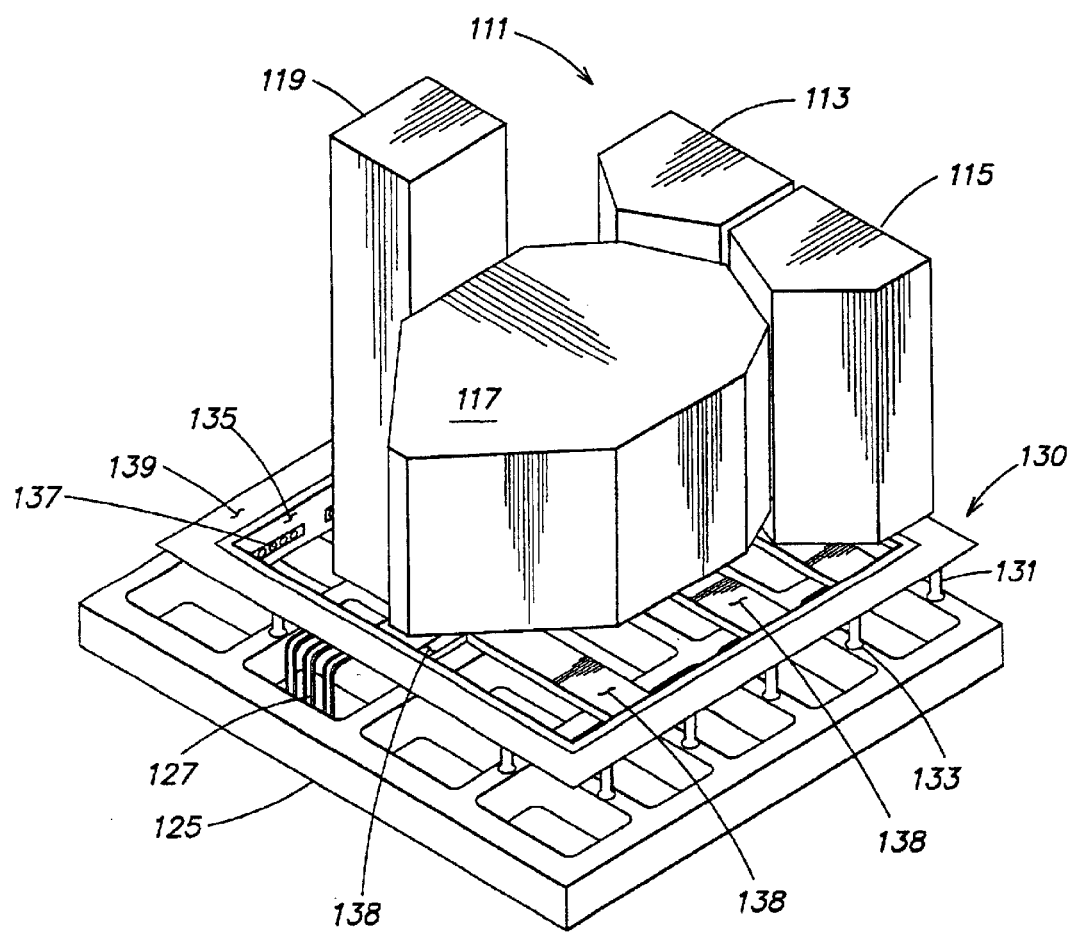
FIG. 3 is a schematic top perspective view of the proposed SEMI rectangular support pedestal with manufacturing equipment installed on the support pedestal.
Figure 4:
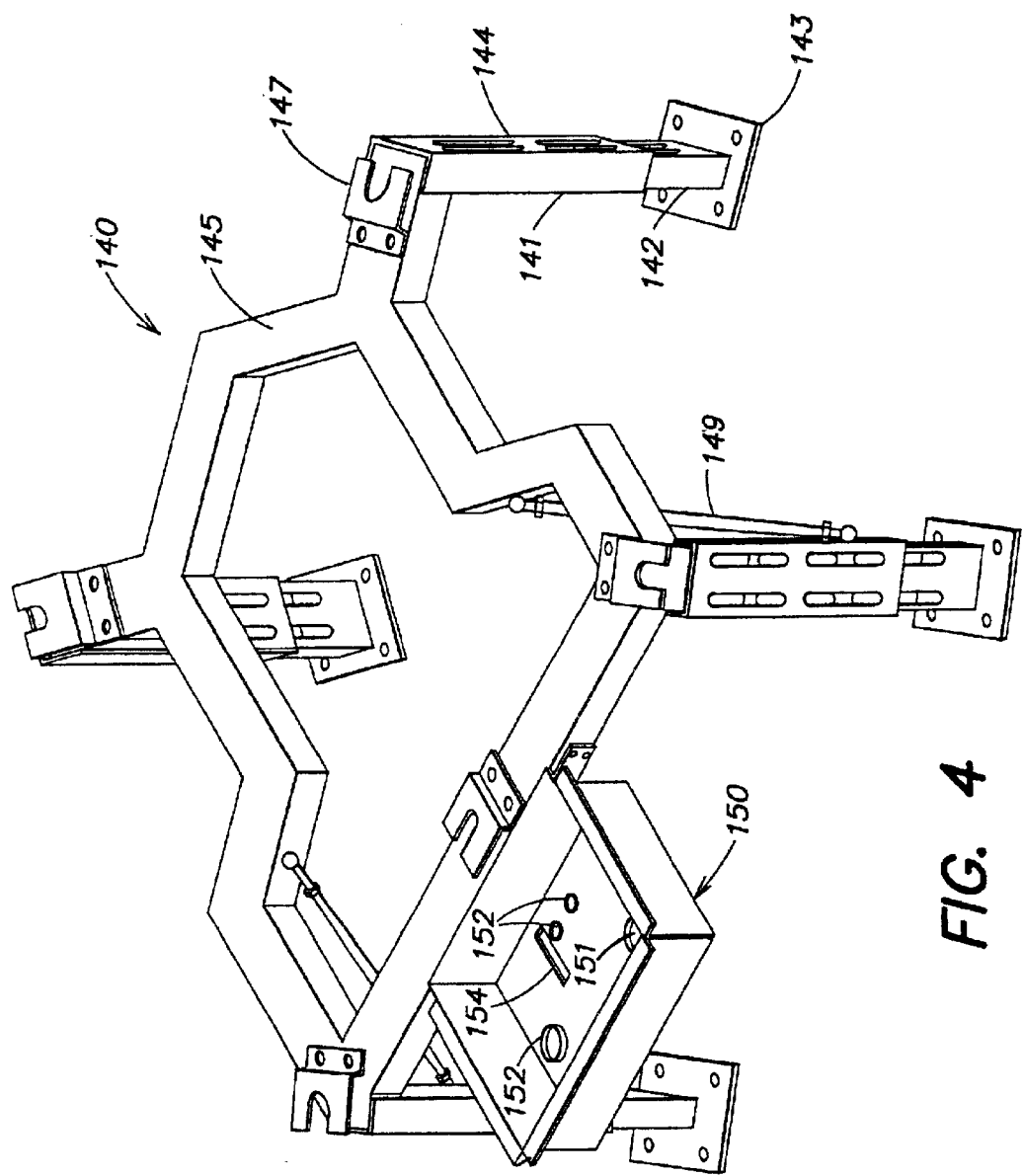
FIG. 4 is a schematic top perspective view of one embodiment of the support pedestal in accordance with the present invention.

FIG. 3 is a schematic top perspective view of the proposed SEMI support pedestal 130 with manufacturing equipment 111 installed thereon. With like reference numerals indicating previously-referenced components, FIG. 3 depicts the SEMI support pedestal 130 having a rectangular SEMI pedestal frame 135 disposed on a plurality of SEMI pedestal support legs 131 which extend down to base mount locations on the waffle-grid floor 125. SEMI facilities connection locations 137 are provided along the SEMI pedestal frame 135 as pre-facilitation locations for connection of facilities lines 127. When manufacturing equipment 111 is installed on the SEMI support pedestal 130, crossbeam members 138 typically must be attached to the SEMI pedestal frame 135 to support the manufacturing equipment 111, and to transfer and distribute the weight of the manufacturing equipment 111 to the SEMI support pedestal 130. Given the fact that the manufacturing equipment 111 has a unique shape, the installation of the manufacturing equipment 111 on a SEMI support pedestal 130 requires "customization" for both support and facilities connections. The SEMI support pedestal 130, by attachment and alignment to the top edge of the SEMI pedestal frame 135, does provide the alignment and leveling reference points for installation of manufacturing equipment 111, and provides pre-plumbing reference points (i.e., the facilities connection locations 137). Nonetheless, the installation of the manufacturing equipment 111 requires customized support fabrication of the crossbeam members 138 and/or cantilevers (not shown), and customized retrofitting for connecting the facilities lines 127 from the facilities connection locations 137 to the actual facilities connection points (not shown) on the manufacturing equipment 111. As noted above, modifications to certain facilities lines can adversely affect the flow through those lines to the potential detriment of both the manufacturing process and the manufacturing equipment 111.

FIG. 4 is a schematic top perspective view of an inventive support pedestal 140. The inventive support pedestal 140 comprises a support frame 145 having a plurality of support legs 141 extending downward therefrom. The support frame 145 has a frame outline which substantially duplicates the bottom outline of the mainframe 117 of the manufacturing equipment 111, with the "bottom outline" of the mainframe 117 being defined by the lower frame of the mainframe 117 itself. In one aspect the support frame 145 may be monolithic so as to provide the enhanced support integrity which comes from a "seamless" frame. The support frame 145 includes brackets 147 for engaging the load-bearing mounting feet of the manufacturing equipment (if any). The support legs 141 are adjustable and comprise an outer leg section 144 fixedly mounted (e.g., bolted or welded) to the support frame 145, and an inner leg section 142. The inner leg section 142 is slideably mounted in the outer leg section 144, so that the length of the support legs 141 can be adjusted and, once optimized, locked in place by bolting or welding the inner leg section 142 to the first outer leg section 144. The support legs 141 are disposed on base mount location pads 143, which can be affixed (e.g., removably via bolts, or welded) to the support legs 142 prior to installation or can be provided at the installation site. Additionally affixed to the support legs 141 are optional seismic braces 149. A first end of each seismic brace 149 is fixedly mounted to a support leg 141 as shown, (or alternatively could be attached directly to the waffle grid flooring) while a second end of the seismic brace 149 is provided for attachment to the manufacturing equipment 111 upon installation thereof.

The inventive support pedestal 140 includes at least one facilities connection locator 150 which is fixedly mounted to the support frame 145 and which establishes the facilities connection locations, representatively shown as the four facilities connection locations 151–154, which exactly match the facilities connection points on the manufacturing equipment 111. Optional outer flanges (not shown) at the periphery of the support frame 145, as well as optional inner flanges (not shown) are provided for supporting raised flooring (as shown in FIG. 5).

Figure 5:
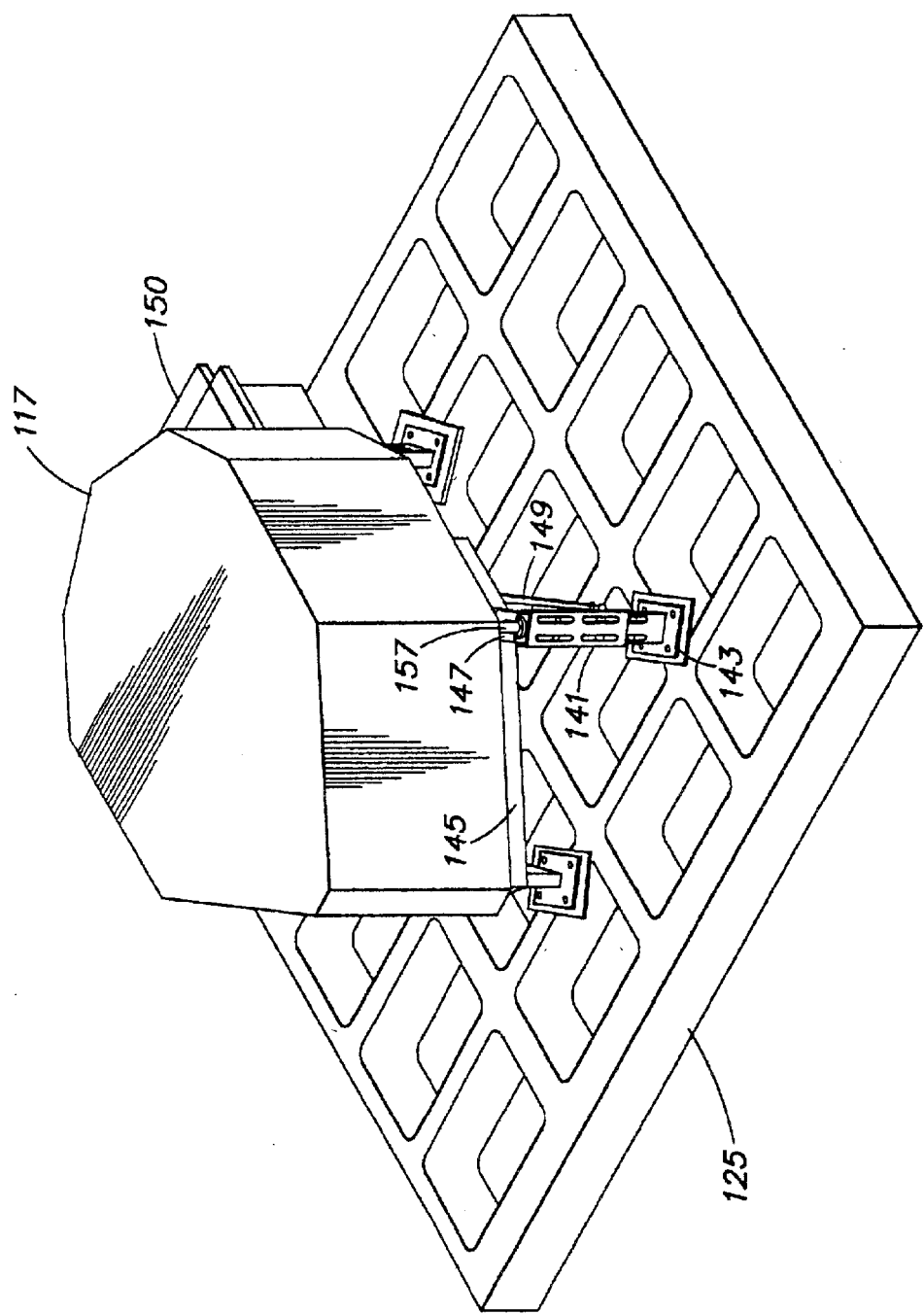
FIG. 5 is a schematic top perspective view of the support pedestal of FIG. 4 installed at a manufacturing location and having manufacturing equipment mainframe attached thereto.
Figure 8:
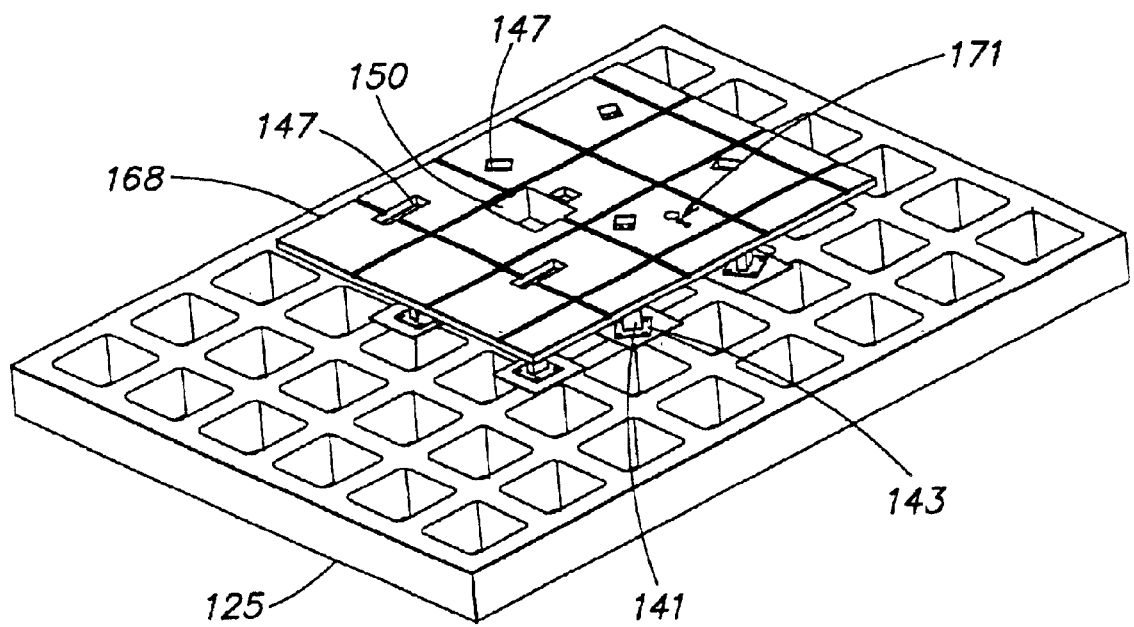
FIG. 8 is a schematic top perspective view of the support pedestal of the present invention installed below the level of a raised floor.

FIG. 5 is a schematic top perspective view of the inventive support pedestal 140 of FIG. 4, installed at a manufacturing location and having the mainframe 117 attached thereto. The inventive support pedestal 140 includes the support frame 145, having a frame outline which substantially duplicates (and preferably exactly duplicates) the bottom outline of the mainframe 117, and a plurality of support legs 141, each of which extends to a base mount location pad 143 positioned on the waffle-grid floor 125. In at least one embodiment of the invention, the frame outline need not substantially (or otherwise) duplicate the bottom outline of the mainframe 117. Seismic braces 149 are attached to the support legs 141 and to the mainframe 117. The facilities connection locator 150 is attached to the support frame 145 to provide the fixed facilities connection locations 151-154 (shown in FIG. 4). The illustrated support pedestal 140 may have raised flooring (not shown) attached at the periphery of the support frame 145. It is to be noted that the support pedestal 140 can alternatively be installed just below the level of the raised flooring, as depicted in FIG. 8 (discussed herein below).

The inventive support pedestal 140 provides manufacturing equipment alignment (due to the shape of the pedestal frame 145) and leveling (due to the adjustable legs), as well as providing fixed facilities connection locations 151–154, all of which can be established in advance of the manufacturing equipment installation with reference to a datum point 100 (FIG. 7) of the factory location. That is, a datum point is identified at the factory location and the support pedestal is aligned, leveled and plumbed with reference thereto. Since the frame outline of the support frame 145 matches the bottom outline of the mainframe 117 of the manufacturing equipment which is installed on the support frame 145, and since the quantity and positioning of the plurality of support legs 141 has been adapted to engage the manufacturing equipment's load-bearing mounting feet for support of the particular manufacturing equipment being supported by the inventive support pedestal 140, no additional support structures (such as the custom-fabricated steel jacks, concrete piers, crossbeams or cantilevers) are required. Furthermore, given the fact that all of the facilities connection locations 151–154 of the facilities connection locator 150 are pre-aligned to the facilities connection points on the manufacturing equipment itself, no retrofitting of facilities lines and connectors is required, thereby avoiding interference with flow patterns within the facilities lines. Using the factory location's datum point, therefore, the factory location can be pre-facilitated with all of the facilities lines pre-plumbed to the specified location of the facilities connection locations 151–154 at the facilities connection locator 150.

Figure 6:
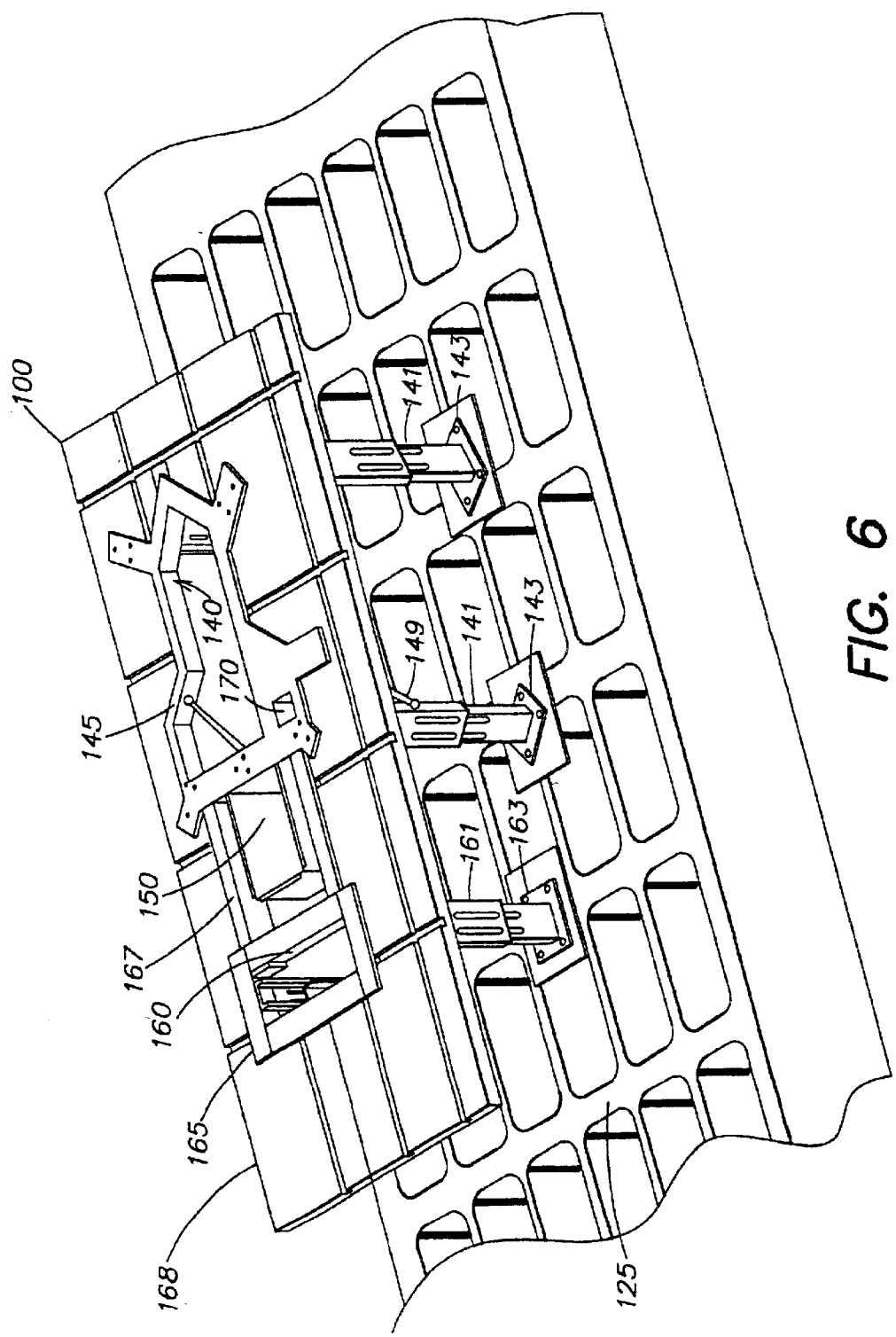
FIG. 6 is a schematic top perspective view of an alternative embodiment of the support pedestal of the present invention installed at a manufacturing location.

The support pedestal 140 is adaptable to specific manufacturing equipment configurations, as illustrated in FIG. 6. For the installation of a semiconductor processing system, such as is depicted in FIG. 1, which includes not only the mainframe processing unit 117 but also the factory interface 114 with loadlock 113 and 115 and a process chamber 119, the support pedestal 140 can be augmented with at least one additional support 160, including an additional frame 165 supported by additional support legs 161 extending to additional base mount location pads 163 to support the factory interface 114, the loadlocks 113, 115 or the processing chamber 119 (FIG. 1). The components of the addition support 160 may be configured in the same manner as the components of the support pedestal 140 with adjustable legs 161 positioned below load bearing mounting of the manufacturing equipment positioned on the additional support 160 and/or frame 165 that duplicates the bottom of the manufacturing equipment. The additional support component 160 may be joined to the support pedestal 140 by connecting segments 167. Alternatively, however, the pedestal frame 140 can be extended to include the support for the additional manufacturing equipment (e.g., the processing chamber 119). Thus, a single support pedestal 140 may be configured to support one or more pieces of manufacturing equipment or a plurality of support pedestals may be coupled directly or via a connecting segment 167. In this example of FIG. 5, the support pedestal 140 includes an additional facilities connection locator 170 with additional facilities connection locations (171 of FIG. 8) as needed (e.g., for the additional processing chamber 119).

Figure 7:
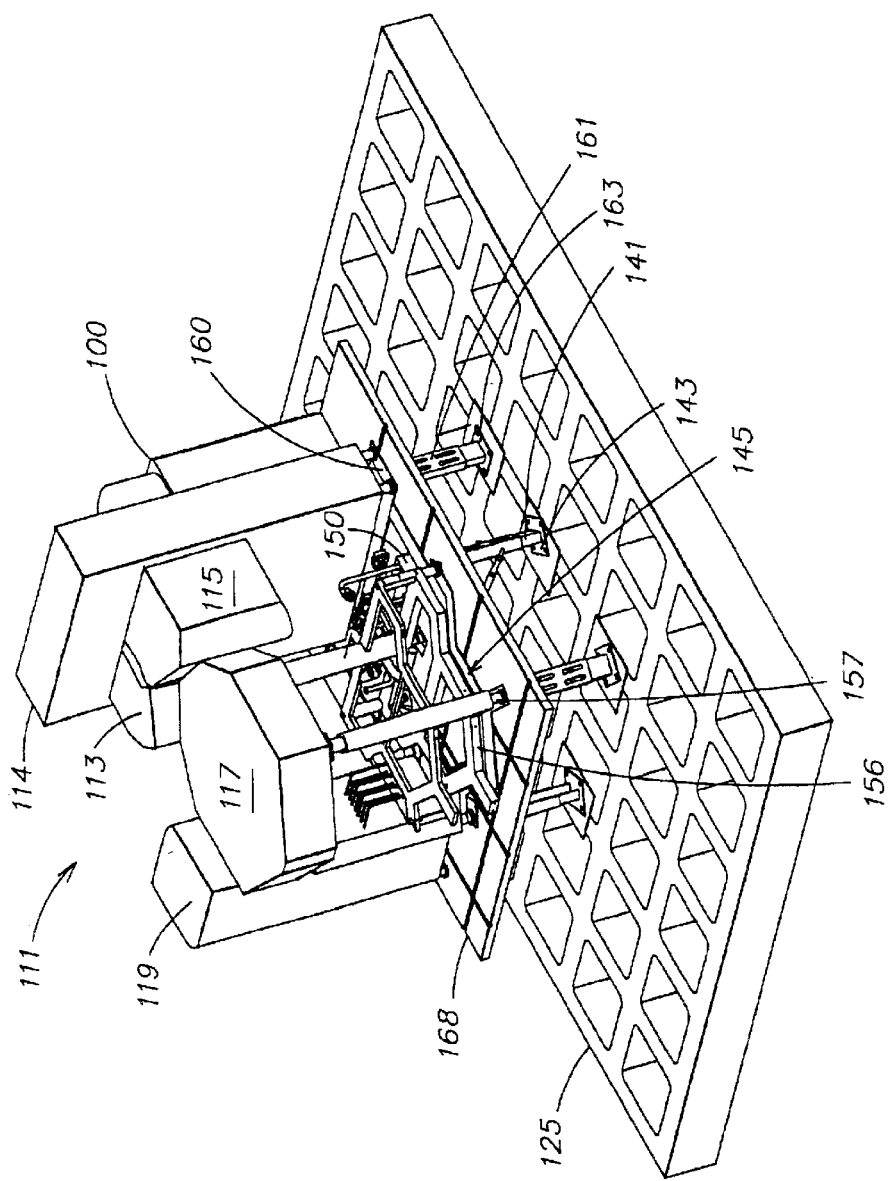
FIG. 7 is a schematic top perspective view of the support pedestal of FIG. 6 installed at a factory location with manufacturing equipment installed thereon.

FIG. 7 is a top perspective view of the support pedestal 140 at a factory location with the manufacturing equipment 111, including the factory interface 114, the loadlocks 113 and 115, the mainframe processing unit 117 (shown partially cut away so that the bottom footprint thereof is visible) and the additional processing chamber 119 installed thereon. The illustrated additional processing chamber 119, like the factory interface 114, may be supported independently as described with reference to FIG. 6. The factory interface 114 is supported by the additional support component 160 comprising additional frame component 165 supported by additional support legs 161 which extend down to additional base mount location pads 163. The mainframe 117 of the manufacturing equipment 111 is mounted on the support frame 145, which is in turn supported by support legs 141 which extend to the base mount location pads 143 coupled (e.g., welded or bolted) to the waffle-grid flooring 125. In the FIG. 7 embodiment, the mainframe processing unit 117 has been provided by the manufacturing equipment supplier on its own mounting frame 156 to which load-bearing mounting feet 157 are affixed. In such an embodiment, the bottom outline of the mainframe 117 is defined by the locations of the load-bearing mounting feet 157 as mounted to the mounting frame 156 (provided by the manufacturing equipment supplier) for the mainframe 117.

FIG. 8 is a schematic top perspective view of the support pedestal 140 of the present invention installed below the level of the raised flooring 168. In such an alternate embodiment, the support frame 145 (not shown) would be installed on support legs 141 which extend down to base mount location pads 143 on the waffle-grid flooring 125 as in the previously-described embodiments. Raised flooring 168 would be installed on top of the support pedestal 140, with openings provided for the facilities connection locator 150 of the mainframe 117 (not shown), for the additional facilities connection locations 171 of the additional facilities connection locator (not shown) which is provided for the additional processing chamber 119 (not shown), and for the brackets 147 which will engage the load-bearing mounting feet 157 of the manufacturing equipment 111.

Figure 9:
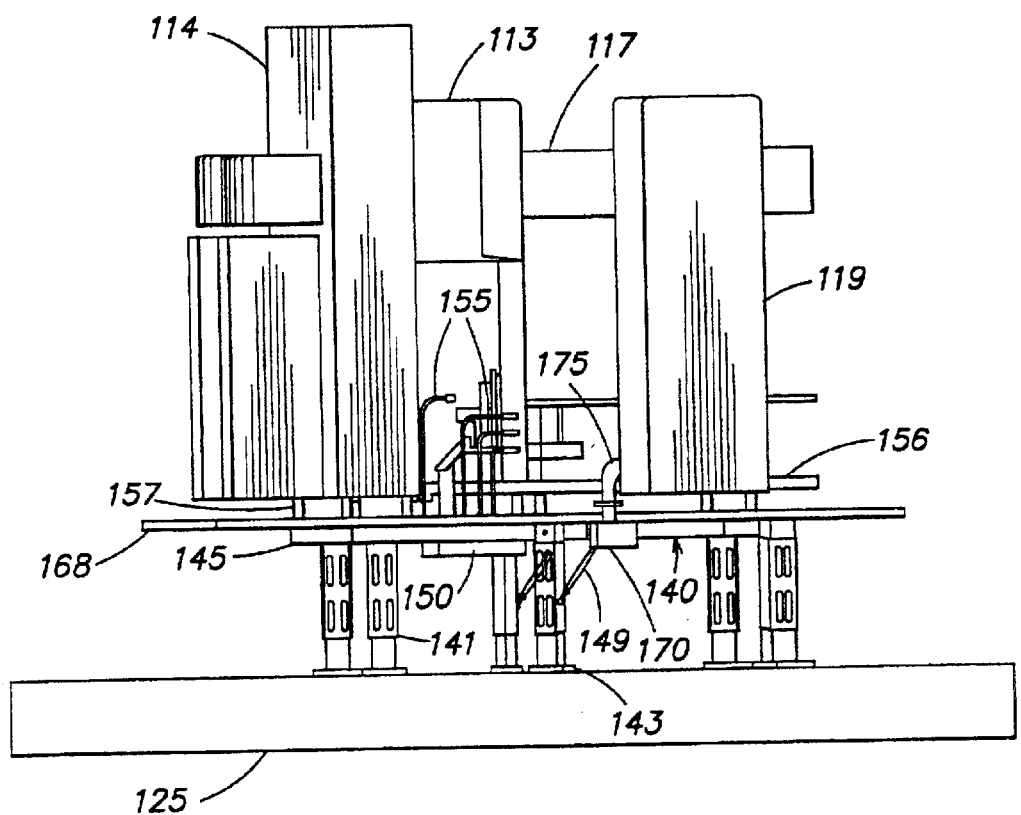
FIG. 9 is a side view of the embodiment of FIG. 8 with manufacturing equipment installed thereon.

FIG. 9 is a side view of the embodiment of FIG. 8 with manufacturing equipment 111 installed thereon. As shown therein, the raised flooring 168 has the openings for brackets 147 (FIG. 8) which accommodate load-bearing mounting feet 157. The mainframe processing unit 117 is provided on its mounting frame 156 which includes load-bearing mounting feet 157 to be attached to the brackets 147 (FIG. 8) of the underlying support pedestal 140. The support frame 145 of the support pedestal 140 is fixedly attached to the plurality of support legs 141, each of which extends to and is coupled to the base mount location pads 143 on the waffle-grid floor 125. Facilities connections 155 are shown projecting up from the facilities connection locations 151–154 (not shown) of facilities connection locator 150 to be provided to the mainframe processing unit 117. The additional processing chamber 119 has additional facilities connections 175 extending up through its additional facilities connection locations 171 (FIG. 6) associated with the additional facilities connection locator 170.

Figure 10:
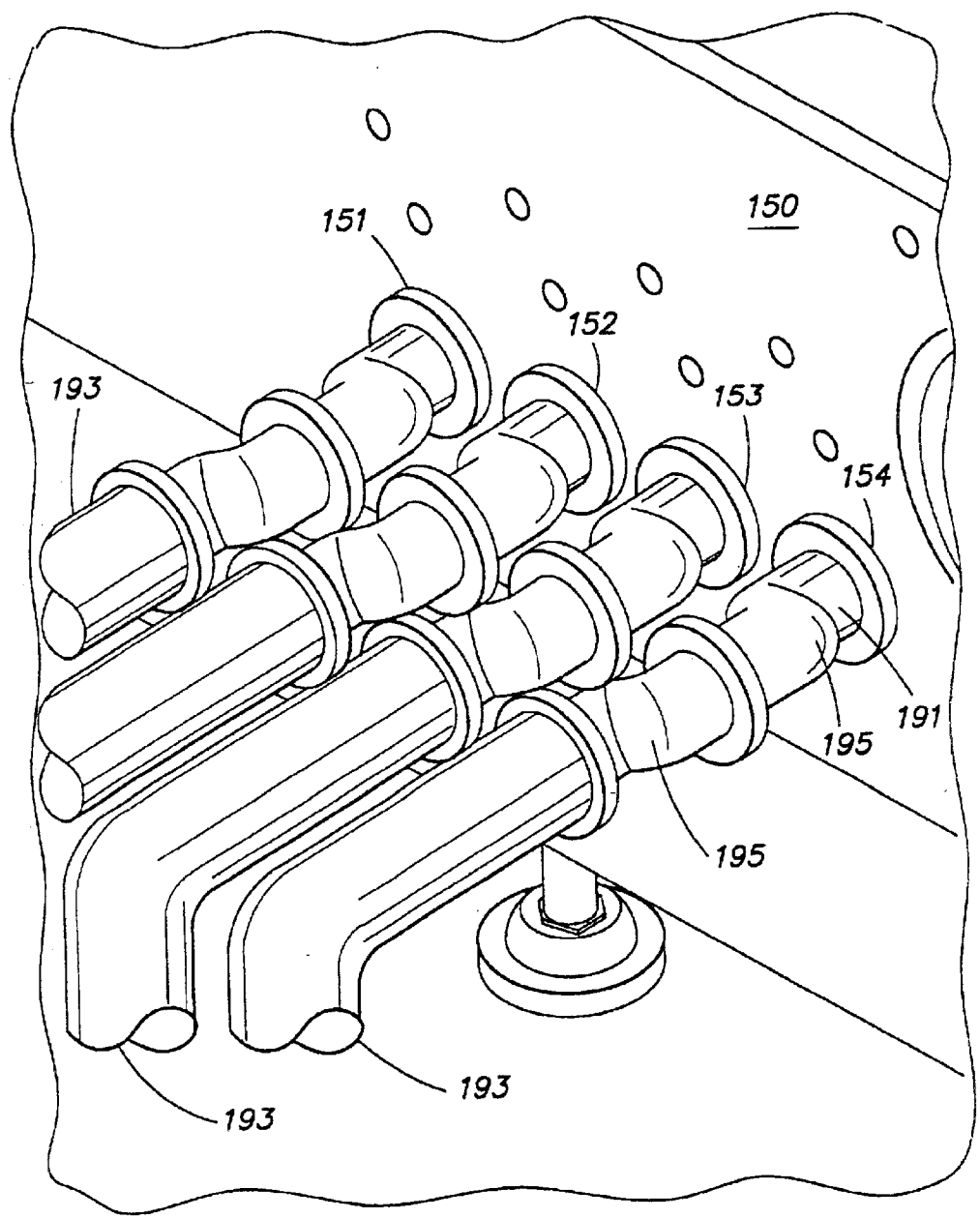
FIG. 10 is a side view of gooseneck connectors at a facilities connection locator of the present invention.

FIG. 10 is a side view of gooseneck connectors 191 which provide facilities connection between the facilities supply lines 193 of a factory location and the facilities connection locations 151–154 of a facilities connection locator 150 of the present invention (or any other facilities connection locations). The gooseneck connectors 191 comprise a plurality of connector segments 195 which are alternately oriented to flexibly approximate a "straight" flow path between the facilities supply lines 193 and the facilities connection locations of the facilities connection locator 150.

The invention has been described with reference to several specific embodiments. One having skill in the relevant art will recognize that modifications may be made without departing from the spirit and scope of the invention. For example, it is to be noted that the manufacturing equipment 111 may include some non-load-bearing feet (hereinafter referred to as "anchoring feet") which may be provided for additional lateral securing of the manufacturing equipment to the support frame 145. The number and locations of the support legs 141 of the inventive support pedestal 140 are selected to match the number and locations of the load-bearing mounting feet 157 on the bottom outline of the manufacturing equipment. It is to be understood that, without departing from the invention as taught and claimed, additional anchoring feet may be provided on the manufacturing equipment, and additional brackets for engaging the anchoring feet may be provided on the inventive support pedestal 140 in locations which may or may not align with support legs 141.

In addition, the illustrated seismic braces, including variable length ball-end rods 149 of FIG. 4, are merely representative of one embodiment of the optional feature. An alternative embodiment would include a piece of thick metal strapping, which would first be secured to the support leg, followed by custom-bending in situ, and then bolting or welding into place. By either method, the support pedestal would be triangulated in orthogonal directions, thus preventing the vertical support legs from deforming to the point of failure during a seismic event.

While it has been taught that a molded, monolithic pedestal frame is advantageous for mechanical integrity, clearly a pedestal frame comprising a plurality of bonded (e.g., welded) or fixedly coupled (e.g., bolted) pieces can be substituted without departing from the invention as claimed.

Yet another modification comprises the use of standardized spacers as the mounting and anchoring feet, in place of the adjustable mounting and anchoring feet which have traditionally been employed for in situ leveling of manufacturing equipment. The inventive support pedestal has adjustable legs which are adjusted prior to installation of the manufacturing equipment to thereby pre-establish the alignment and leveling of the manufacturing equipment; therefore, fixed spacers are recommended since the fixed spacers maintain the fixed parallel relationship between the support frame and the manufacturing equipment which has been established relative to the datum point and since no in situ leveling of the manufacturing equipment will be required.

The support leg sections could also be tubular, right angle sections ("angle iron"), or triangular or etc., they need not be rectangular. Also, the lower portion of the support leg could be either the outer or the inner portion. As an alternative to being bolted-on, the mounting of the support legs to the pedestal frame could also be welded-on, designed so that they would attach underneath the frame (in compression), or designed to fit into underside receptacles fabricated as part of the frame itself, or some combination of these.

Finally, pre-facilitation of a factory location can be conducted using a "map" of the support pedestal and its facilities connection locator with facilities connection locations defined relative to a datum point of the factory location. A medium (polycarbonate film) having a full-scale outline of the inventive support pedestal, with or without facilities connection locations denoted, can be delivered to the factory location prior to installation of the support pedestal. Once the polycarbonate film is spread out on the factory floor relative to the datum point, the x and y coordinates (i.e., the coordinates in the horizontal plane) for each facilities connection location will be precisely defined in situ and appropriate plumbing, electrical, construction can be performed prior to installation of the inventive support pedestal.

Figure 11:
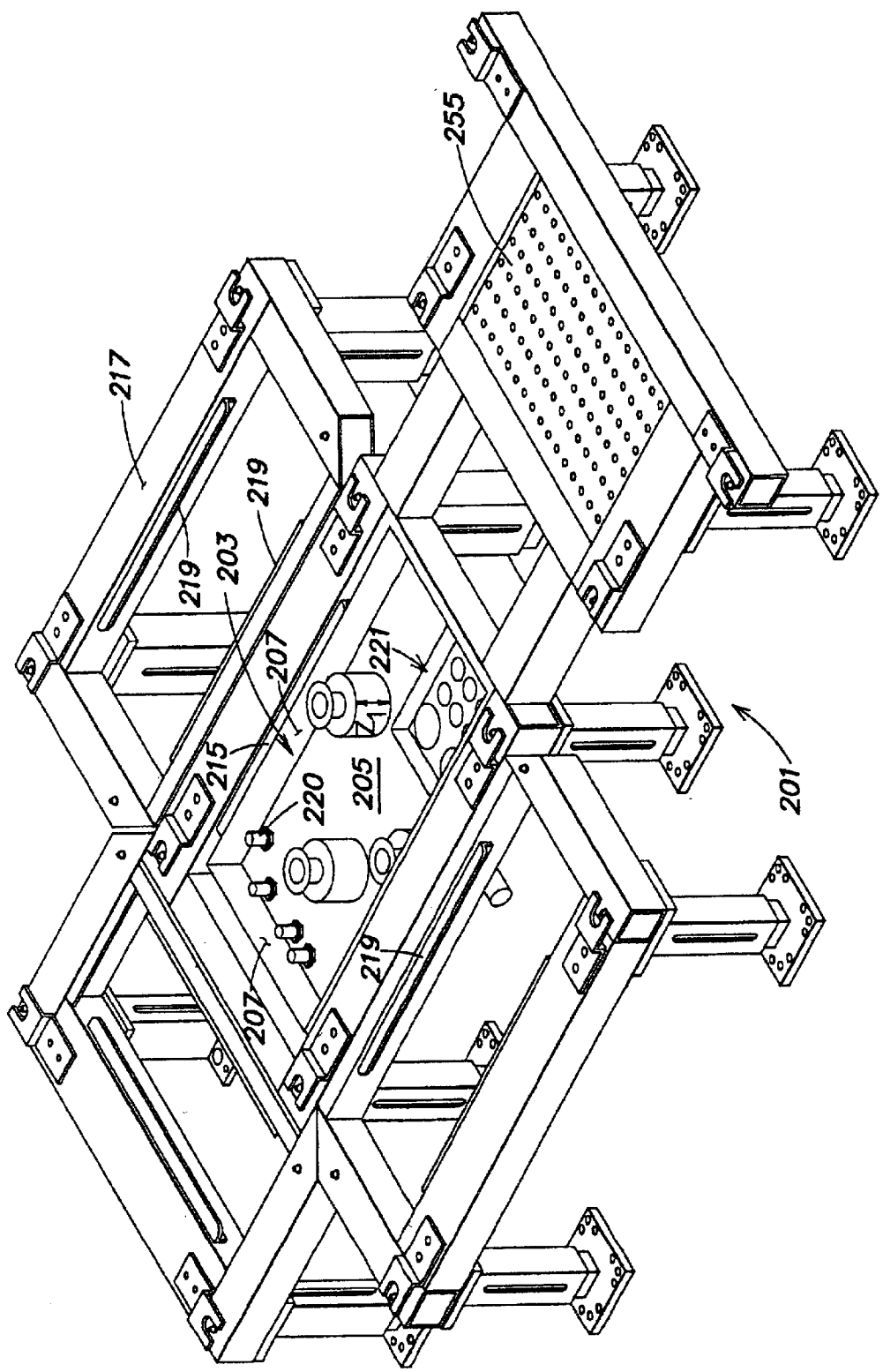
FIG. 11 is an isometric view, taken from above, of a manufacturing equipment support apparatus, showing an improved facilities connection locator coupled thereto.

FIG. 11 is an isometric view, taken from above, of a manufacturing equipment support apparatus 201, showing an improved facilities connection locator 203 coupled thereto. The facilities connection locator 203 comprises a bottom surface 205 and a plurality of side walls 207 extending upwardly therefrom so as to form a fluid tight "bucket." The facilities connection locator 203 has at least one fluid connection port formed therein and may also have any number of vacuum connection ports, and/or facilities connection plates, the features of which are best understood with joint reference to FIG. 11 and to FIGS. 12–17 which show various views of the facilities connection locator 203 and/or its facilities line connectors.

Figure 12:
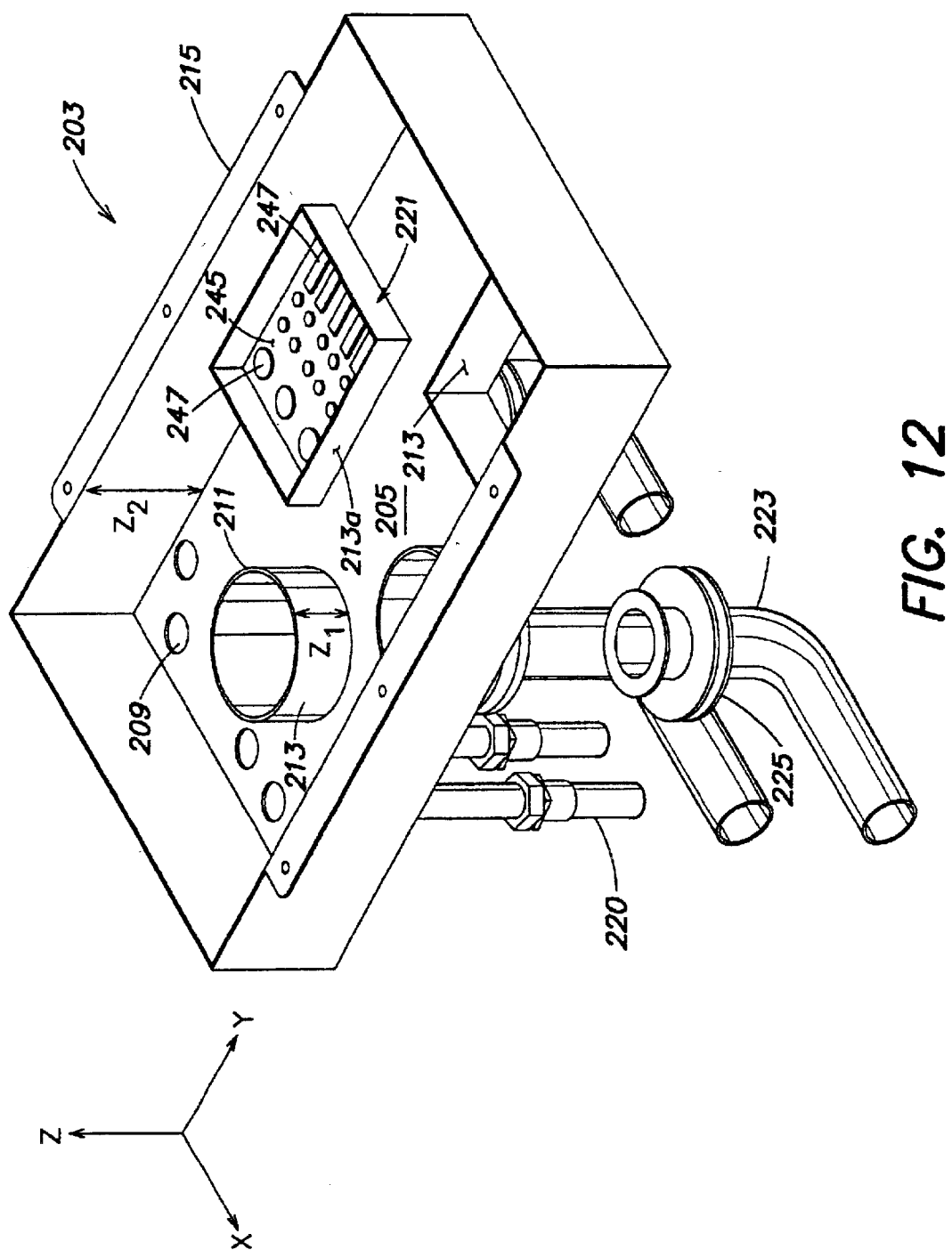
FIG. 12 is an exploded close up isometric view of the facilities connection locator of FIG. 11, taken from above.
Figure 16:
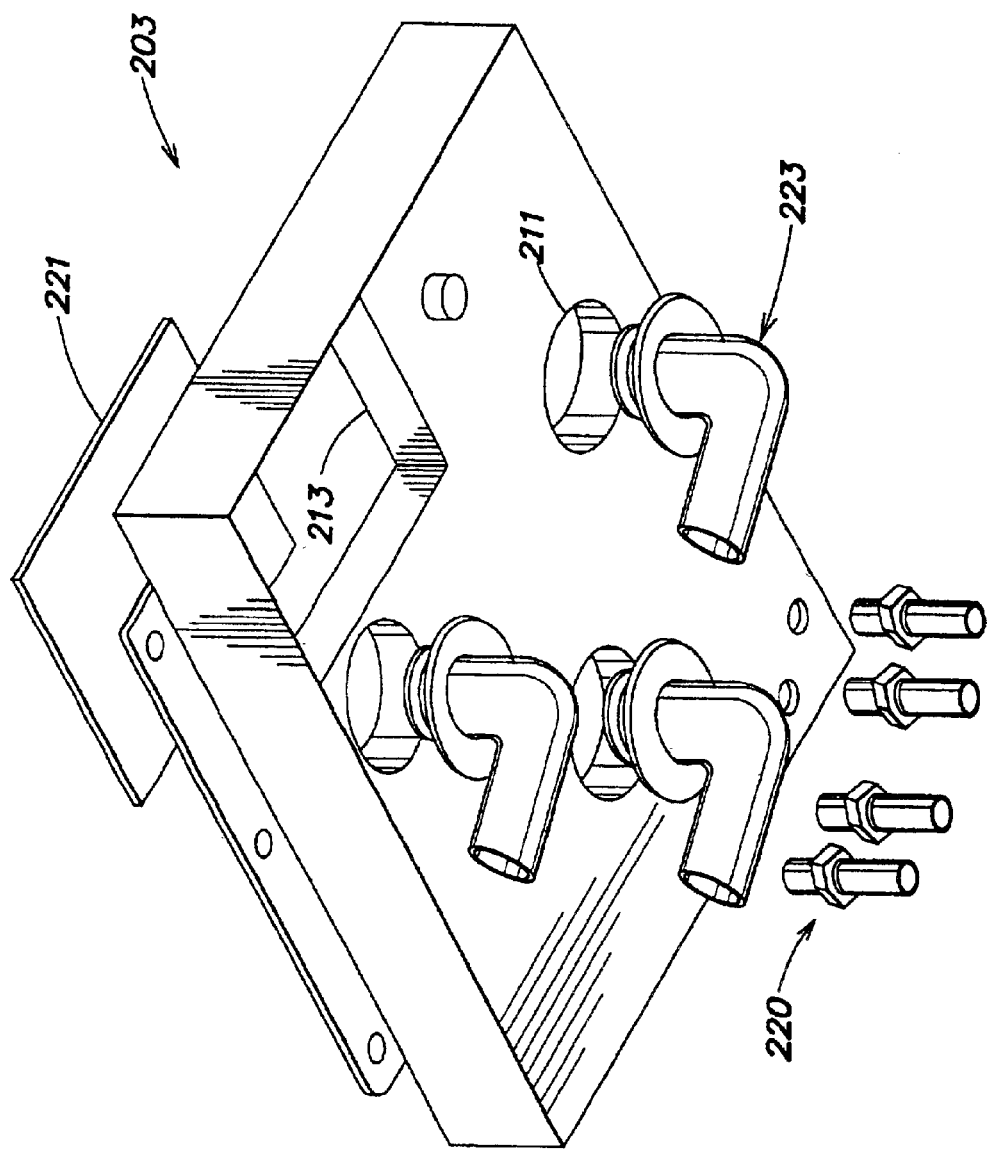
FIG. 16 is an exploded close up isometric view of the facilities connection locator of FIG. 11, taken from below.

The exemplary facilities connection locator 203 shown comprises four fluid connection ports 209 (FIG. 12) and three vacuum connection ports 211 (FIG. 12 and FIG. 16). Each vacuum connection port 211 is shown surrounded by a riser 213.

A mounting mechanism (such as mounting flanges 215) extends from the facilities connection locator 203 and interfaces with features of the equipment support apparatus 201 so that the facilities connection locator 203 is mounted to the equipment support apparatus 201 with a predetermined relationship (i.e., such that features of the facilities connection locator 203 are fixed in the x-axis and y-axis directions relative to the outline or footprint of the equipment support apparatus 201, and are fixed in the z-axis direction relative to a top surface 217 of the equipment support apparatus 201). In the exemplary embodiment shown, the mounting flanges 215 of the facilities connection locator 203 rest on corresponding mounting flanges 219 located within the footprint of the equipment support apparatus 201 and recessed slightly below the top surface 217 of the equipment support apparatus 201 such that the top surface of the facilities connection locator 203 and the mounting flanges 215 thereof is flush with the top surface 217 of the equipment support apparatus 201.

Consider, for example the riser 213, each of which extends a predetermined height $Z_1$, above the bottom surface 205. Accordingly, because the bottom surface 205 is a predetermined height $Z_2$ below the top surface 217, the z-axis position of the top of the riser 213 is known relative to the top surface 217. The same principle is true for the remaining features of the equipment support apparatus 201, such as the z-axis position of any fluid line connectors 220 relative to the top surface 217 or the z-axis position of any facilities connection plate 221 relative to the top surface 217.

Figure 13:
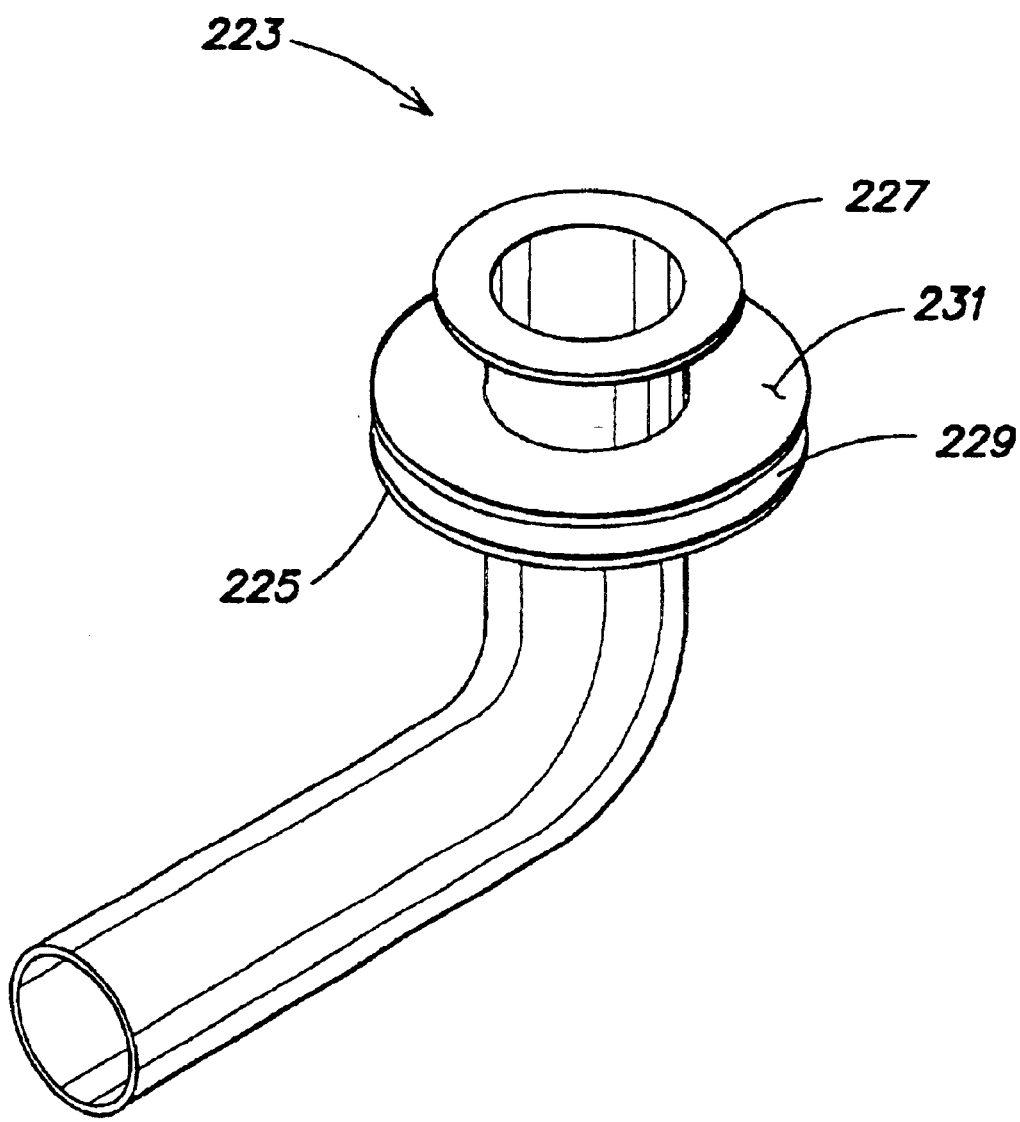
FIG. 13 is an isometric side view, taken slightly from below, of a facilities connection line of FIG. 11.
Figure 14:
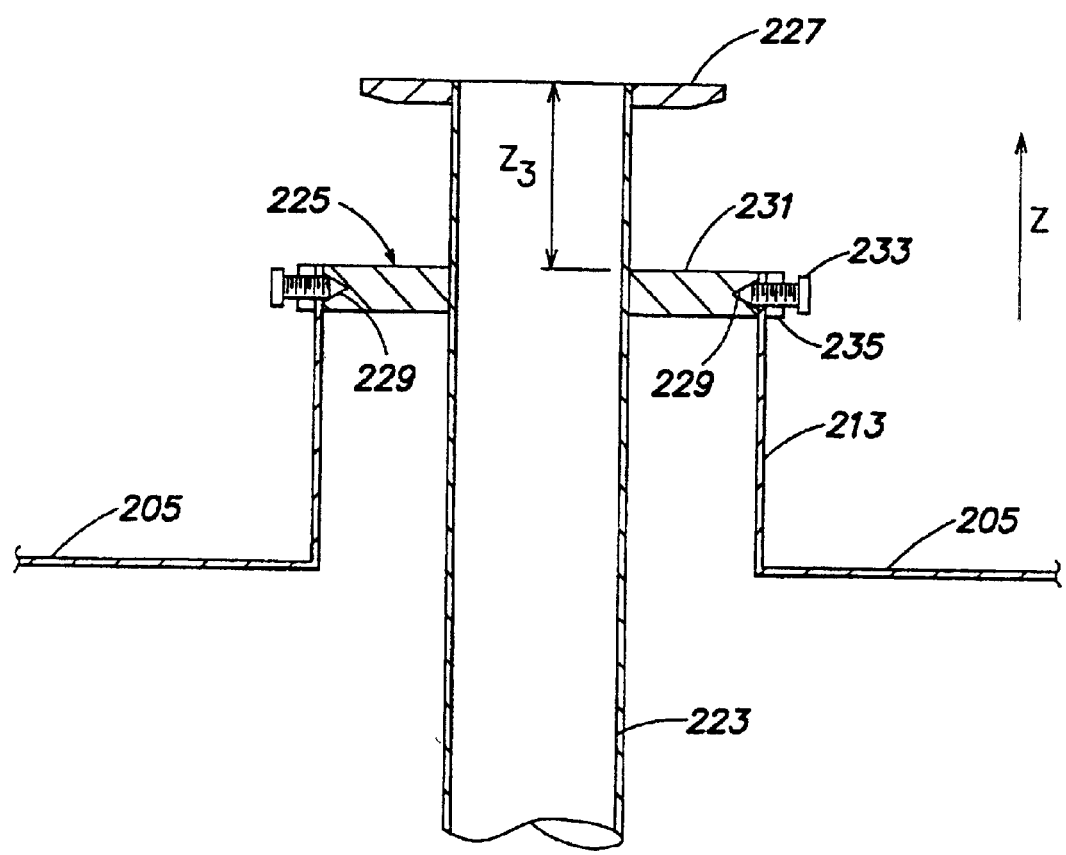
FIG. 14 is a side view showing the facilities connection line of FIG. 13 coupled to a facilities connection port in a fixed relationship.

The riser 213 may be employed with a facilities connection line 223 having a z-axis locating mechanism such as a locating flange 225, best understood with reference to FIGS. 13 and 14. As shown in FIGS. 13 and 14, the facilities connection line 223 has a top surface 227 which may comprise a flange, as shown. The top surface 227 has a fixed height relationship $Z_3$ with respect to the top of the riser 213 (FIG. 14). Thus, as the top of the riser 213 has a fixed z-axis position with respect to the top surface 217, so does the top surface 227.

In order to facilitate accurate z-axis positioning/mounting between the locating flange 225 and the riser 213, the locating flange 225 may comprise a V-shaped groove 229, and the riser 213 may comprise a plurality of holes (not shown) formed at a predetermined height above the bottom surface 205. In one aspect the V-shaped groove 229 and the holes (not shown) in the riser 213 are configured such that when a top surface 232. of the locating flange 225 is flush with the top surface of the riser 213, the center of the V-shaped groove 229 is adjacent the holes. A screw 233 may then be threaded through a nut 235 and through the hole in the riser 213 so as to extend into the center of the V-shaped groove 229. As will be apparent, the nut 235 ensures that the screw 233 is normal to the hole in the riser 213, and the normally positioned screw 233 contacts the equally sloped sides of the V-shaped groove 229 ensuring that the facilities connection line 223 is precisely positioned in the z-axis direction. Although the facilities connection line 223 is shown only as a vacuum line connection in the figures, it will be understood that the facilities connection line 223 also may be employed as a fluid line connector.

Figure 15A:
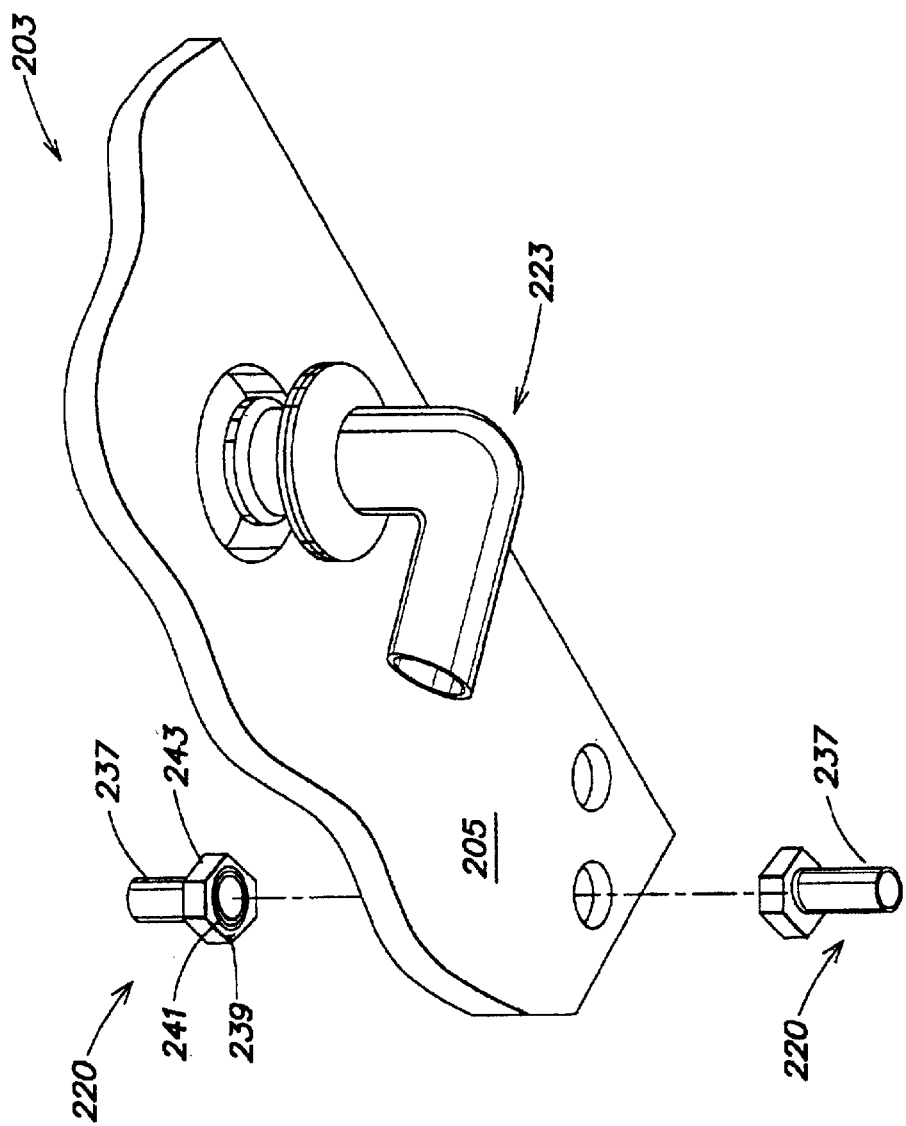
FIG. 15A is a bottom isometric view of a first fluid line connector.

In one aspect, the fluid line connectors 220 may be configured as shown in the bottom isometric view of FIG. 15A. Each fluid line connector 220 comprises a fluid line 237 having a planar surface 239 that extends horizontally from the fluid line 237 and, when coupled to the facilities connection locator 203, is positioned such that the planar surface 239 extends along the interior side of the facilities connection locator 203's bottom surface 205. An o-ring 241 is disposed along the planar surface 239 so as to form a fluid tight seal between the planar surface 239 and the interior side of the facilities connection locator 203's bottom surface 205. A portion of the fluid line 237 that is to extend downward from an exterior surface of the facilities connection locator 203's bottom surface 205 is threaded (not shown) so that a threaded nut 243 may be threaded thereon, as shown. Thus, the nut 243 may be tightened such that the o-ring 241 is held firmly between the planar surface 239 and the facilities connection locator 203's bottom surface 205, forming a fluid tight seal. Because the planar surface 239 has a fixed offset from the top of the fluid line 237, and the fluid line 237 has a known height, the top of the fluid line 237 is a fixed or known distance from the bottom surface 205 of the facilities connection locator 203, and from the top surface 217.

Figure 15B:
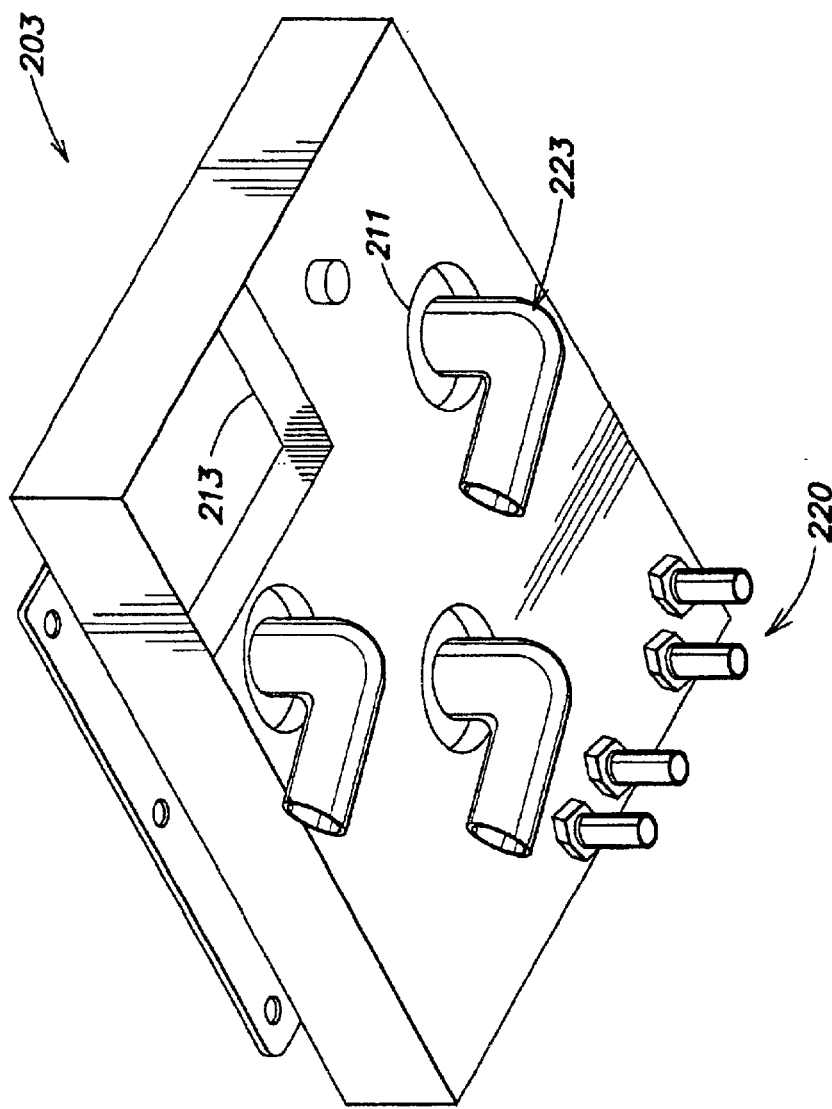
FIG. 15B is a bottom isometric view of a second fluid line connector.

Any of the connections described above may also be welded to the facilities connection locator 203, as shown in FIG. 15B. By welding or otherwise integrally forming vacuum and/or fluid line connectors to the bottom surface 205, the facilities connection locator 203 is fluid tight without the need for the special fluid tight design of the fluid line connectors 220 described above, and without the need for the riser 213. Further, the welded or integrally formed fluid line connectors 220 and facilities connection lines 223 will have fixed positions (in the x-y and z axis) relative to the facilities connection locator 203 and hence relative to the top surface 217 of the equipment support apparatus. Such welded/integral fluid line connectors 220 and facilities connection lines 223 are shown in the isometric view of FIG. 15B, and may also have an optional industry standard clamp flange (not shown).

Figure 17:
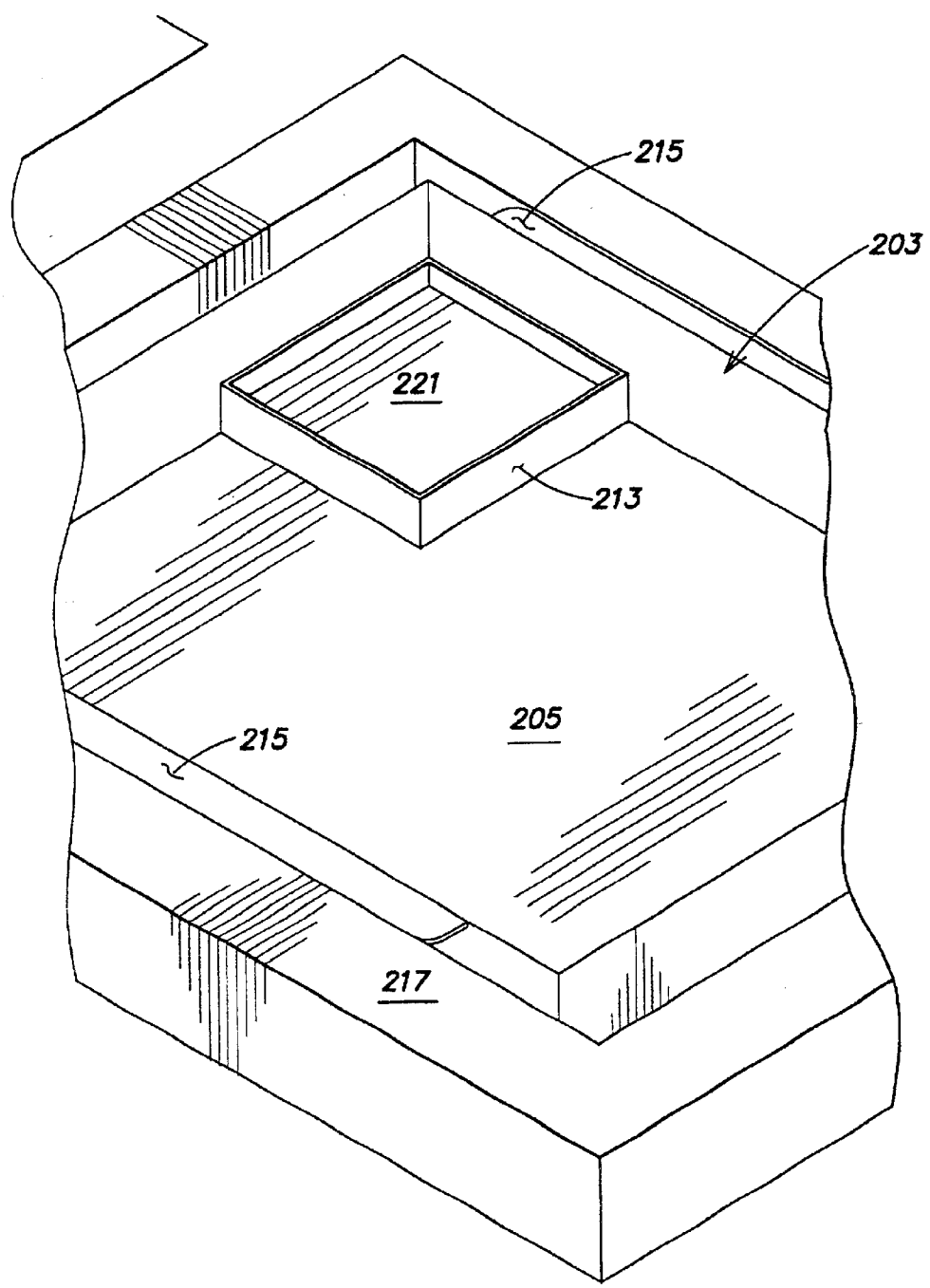
FIG. 17 is a close up isometric view of the facilities connection locator of FIG. 11 taken from above and at an angle that better shows a riser surrounding a facilities connection plate thereof.

An optional feature of the facilities connection locator 203 is the facilities connection plate 221, which is best shown by FIGS. 16 and 17. FIG. 16 is an exploded close up isometric view of the facilities connection locator 203, taken from below; and FIG. 17 is a close up isometric view of the facilities connection locator 203 taken from above and at an angle that better shows a riser 213 that surrounds the facilities connection plate 221.

As with the vacuum connection port 211, the riser 213 surrounds the facilities connection plate 221 so that if fluid should fill the facilities connection locator 203, the facilities connection plate 221 will be protected therefrom. As best shown in FIG. 12 the facilities connection plate 221 may also have an integrally formed riser 213a which makes mounting of the facilities connection plate 221 easier. The integrally formed riser 213a may also have welded corners so as to be fluid tight. The connection plate's riser 213a is adapted to couple to the riser 213 so that a bottom surface 245 of the facilities connection plate 221 is a fixed height above the bottom surface 205 of the facilities connection locator 203, and thus, is a fixed height offset from the top surface 217. Alternatively, rather than a riser, the connection plate 221 may have an integral edge that extends downwardly to facilitate mounting of the connection plate 221. The facilities connection plate 221 has a plurality of removable panels 247 (e.g., knock out panels with perforated edges that facilitate easy removal) that may be individually removed to allow facilities lines (e.g., electrical, gas, fluid or pressure lines, etc.) to pass therethrough.

Figure 18:
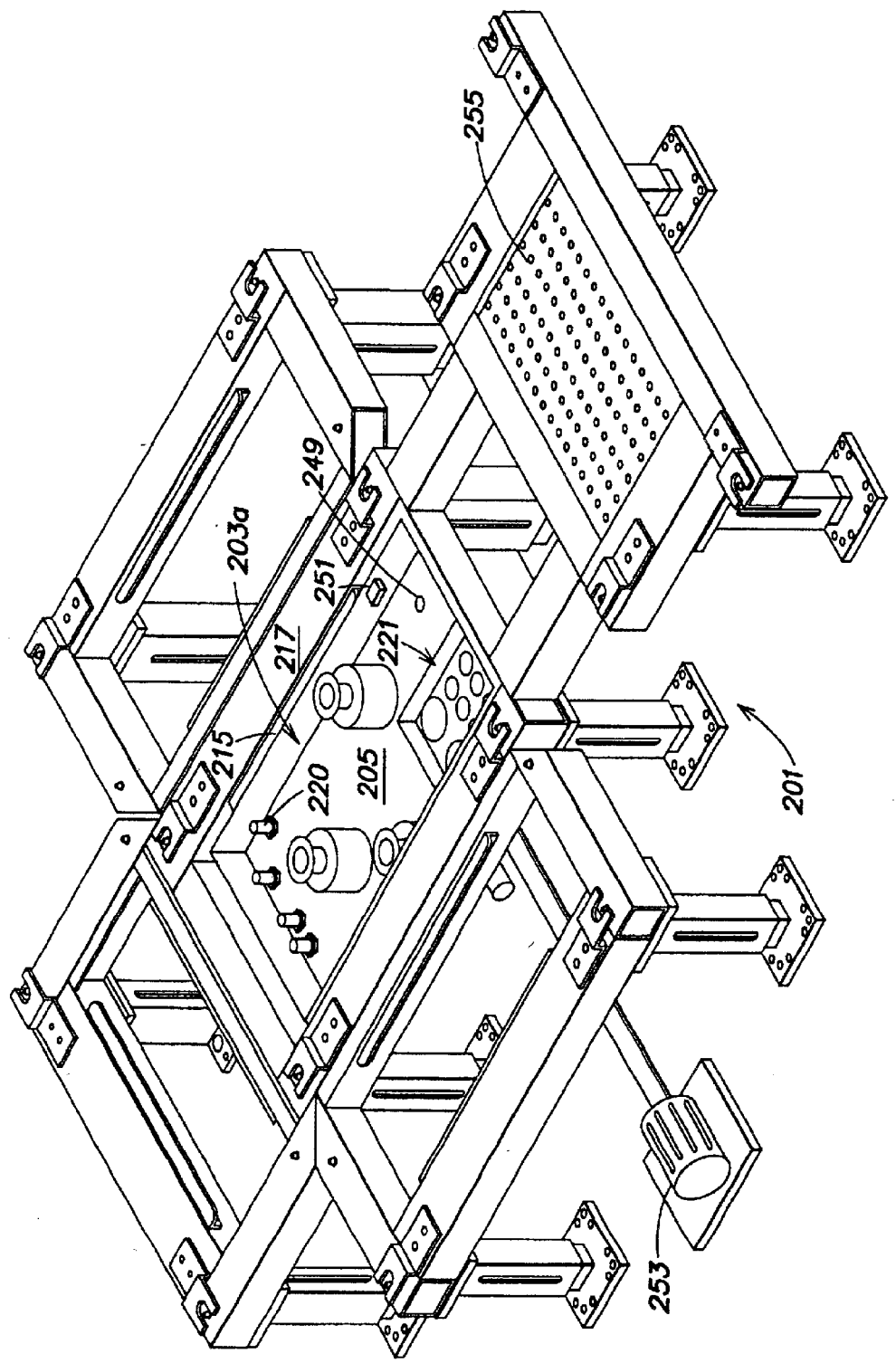
FIG. 18 is an isometric view, taken from above, of a manufacturing equipment support apparatus, showing an improved facilities connection locator coupled thereto and having additional features not shown in FIG. 11.

FIG. 18 is an isometric view, taken from above, of a manufacturing equipment support apparatus, showing an improved facilities connection locator 203a coupled thereto and having additional features not shown in FIG. 11. The facilities connection locator 203a has the additional feature of a gravity drain 249, located on the bottom surface 205 of the fluid tight bucket 203. The bottom surface 205 may be sloped, such that the drain 249 is at a slightly lower elevation than the remainder of the bottom surface 205. Also shown in FIG. 18 is a liquid level sensor 251 that detects when fluid in the facilities connection bucket 203 has reached a certain level. The liquid level sensor 251 may be coupled to a controller (not shown) that will notify an operator of the fluid level, will shut off the fluid flow through the fluid line(s) connected to the facilities connection locator 203 and/or will activate a fluid pump coupled to the facilities connection locator 203. A fluid pump 253 which automatically begins to pump fluid when it senses the same may also be employed.

A further feature that may be employed with any equipment support apparatus, is an airflow control plate 255 as shown in FIG. 11. The airflow control plate 255 may be mounted to the support apparatus via a plurality of flanges or any other suitable mechanism. The airflow control plate 255 has a plurality of openings (e.g., evenly distributed holes of equal size) to control airflow. The plate may be adapted to fully or partially occupy an interior region of the support apparatus' frame outline. Accordingly, where gaps exist between the installed equipment and the pedestal's top surface, the airflow control plate 255 may be installed to reduce turbulence, and/or to prevent objects from falling into the gap.

Like the airflow control plate 255, the facilities connection locator 203 may be any size and shape, and may occupy all or any portion of the outline of the support apparatus' outline. Both the airflow control plate 255 and facilities connection locator 203 may also be mounted to extend beyond the outline of the support apparatus' frame. Such a facilities connection locator 203 would still provide accurate positioning of facilities lines with respect to the top surface 217 of the equipment support apparatus 201, and such an airflow control plate 255 would still provide airflow management and safety functions.

Accordingly, while the present invention has been disclosed in connection with the preferred embodiments thereof, it should be understood that other embodiments may fall within the spirit and scope of the invention, as defined by the following claims.

The invention claimed is:

1. A facilities connection locator for use with a support apparatus for supporting manufacturing equipment, comprising:
a fluid tight bucket having:
a bottom surface;
a plurality of side walls extending upwardly from the bottom surface;
a mounting mechanism adapted to mount the fluid tight bucket to a support apparatus for supporting manufacturing equipment so that the fluid tight bucket has a fixed position relative to the support apparatus in an x-axis, a y-axis and a z-axis;
at least one fluid connection port formed in the fluid tight bucket;
a vacuum connection port;
a fluid tight riser that surrounds the vacuum connection port, the fluid tight riser having a plurality of openings formed therein;
a facilities connection line extending through the vacuum connection port and fixedly coupled to the fluid tight riser, comprising:
a top surface; and
a locating flange positioned a fixed distance below the top surface, and adapted to be fixed in place relative to the fluid tight riser; and
a plurality of elements that extend through the plurality of openings, to contact the locating flange and thereby fix the facilities connection line in place relative to the fluid tight riser.

2. The facilities connection locator of claim 1, further comprising:
a mechanism for mounting a fluid line connection to the fluid tight bucket such that a top of the fluid line connection extends to a predetermined height relative to a top surface of the support apparatus.

3. The facilities connection locator of claim 1, further comprising:
a mechanism for mounting a vacuum line connection to the fluid tight bucket such that a top of the vacuum line connection extends to a predetermined height relative to a top surface of the support apparatus.

4. The facilities connection locator of claim 1, further comprising:
a fluid level detector adapted to detect when a fluid level within the fluid tight bucket reaches a predetermined level.

5. The facilities connection locator of claim 1, further comprising:
a fluid drain.

6. The facilities connection locator of claim 1, further comprising:
a pump coupled to the fluid tight bucket so as to pump fluid therefrom.

7. The facilities connection locator of claim 1, wherein the facilities connection line comprises
a vacuum line connection extending through the vacuum connection port and having the top surface and the locating flange located a predetermined distance from the top surface, the locating flange being coupled to the fluid tight riser so as to fix the height of the top surface of the vacuum line connection at a predetermined height relative to a top of the fluid tight riser.

8. The facilities connection locator of claim 1, further comprising;
a facilities connection locator plate surrounded by a second fluid tight riser, and having removable panels through which facilities lines may extend.

9. The facilities connection locator of claim 8, further comprising:
a fluid line connection having a fluid line extending through the at least one fluid connection port and having a planar surface extending from the fluid line horizontally along an interior side of the bottom surface of the fluid tight bucket, and an o-ring positioned between the planar surface and the interior side of the bottom surface of the fluid tight bucket, and a nut threadedly coupled to the fluid line so as to hold the O-ring firmly against the bottom surface of the fluid tight bucket, creating a fluid tight seal therebetween.

10. The facilities connection locator of claim 1, further comprising:
    a fluid line connection having a fluid line extending through the at least one fluid connection port and having a planar surface extending from the fluid line horizontally along an interior side of the bottom surface of the fluid tight bucket, and an o-ring positioned between the planar surface and the interior side of the bottom surface of the fluid tight bucket, and a nut threadedly coupled to the fluid line along an exterior side of the bottom surface of the fluid tight bucket.

11. The facilities connection locator of claim 1, wherein the fluid tight bucket further comprises a second fluid tight riser surrounding the at least one fluid connection port.

12. The facilities connection locator of claim 1, wherein the facilities connection line comprises
    a vacuum line connection extending through the vacuum connection port to a predetermined height thereabove, and welded to the fluid tight bucket.

13. The facilities connection locator of claim 1, further comprising:
    a fluid line connection extending through the at least one fluid connection port to a predetermined height thereabove, and welded to the fluid tight bucket.

14. The facilities connection locator of claim 1, wherein the support apparatus for supporting manufacturing equipment has a bottom outline and a plurality of load-bearing mounting feet disposed along the equipment's bottom outline, wherein the support apparatus further comprises:
    a plurality of support legs including at least one support leg aligned to each one of the plurality of load-bearing mounting feet; and
    a frame disposed on the plurality of support legs, the frame having a frame outline which substantially duplicates the bottom outline of the manufacturing equipment.

15. The facilities connection locator of claim 14,
    wherein the mounting mechanism is for mounting the fluid tight bucket to the support apparatus so that the fluid tight bucket is located outside of a perimeter of the support apparatus.

16. The facilities connection locator of claim 1,
    wherein the mounting mechanism is for mounting the fluid tight bucket to the support apparatus so that the fluid tight bucket is located outside of a perimeter of the support apparatus.

* * * * *